March 20, 1956 W. R. KOCH 2,739,189

GROUNDED GRID UHF AMPLIFIER WITH GAIN CONTROL AND CONSTANT INPUT IMPEDANCE

Filed July 12, 1950

INVENTOR
WINFIELD R. KOCH
BY
ATTORNEY

United States Patent Office 2,739,189

Patented Mar. 20, 1956

2,739,189

GROUNDED GRID U. H. F. AMPLIFIER WITH GAIN CONTROL AND CONSTANT INPUT IMPEDANCE

Winfield Rudolph Koch, Marlton, N. J., assignor to Radio Corporation of America, a corporation of Delaware Application July 12, 1950, Serial No. 173,268

4 Claims. (Cl. 179—171)

Figures 1, 2, 3:
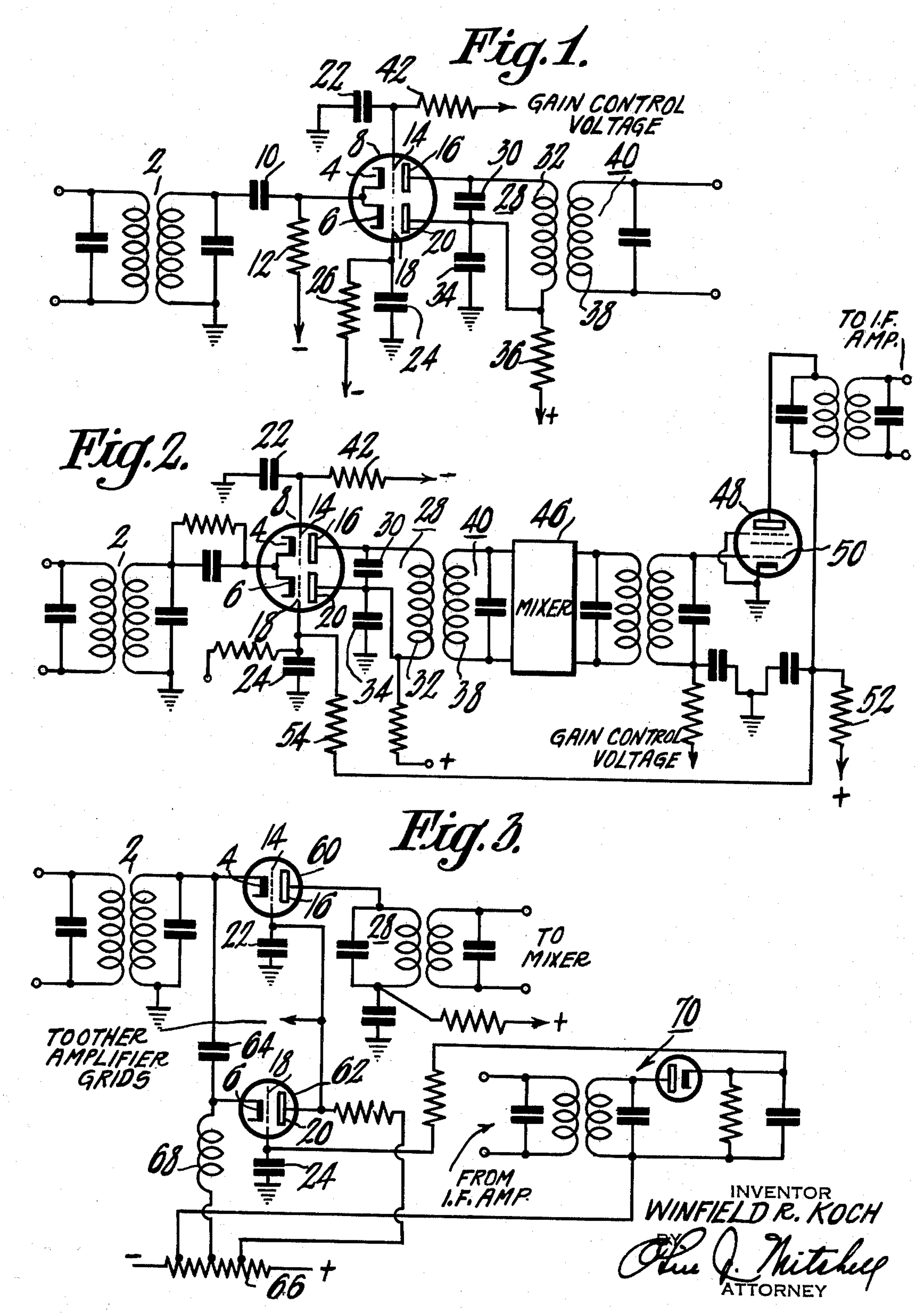

This invention relates to the gain control and more particularly to gain control of grounded-grid amplifiers.

In television and other U. H. F. receivers grounded-grid radio-frequency amplifiers have been employed in order to obtain a good signal-to-noise ratio. Generally, however, the gain of the receiver is controlled by biasing the grid of the R. F. amplifier. Where grounded-grid amplifiers are employed, this narrows the selectivity of the input circuit and mismatches the transmission line feeding the receiver so as to cause ghosts and distortion.

In accordance with this invention, the input impedance of a grounded-grid amplifier is maintained constant for all conditions of gain by employing a separate electron discharge device. The circuit relationships between the grounded grid amplifier and the separate electron discharge device are such that an increase in the input impedance of one is accompanied by a proportional decrease in the input impedance of the other. Therefore, the composite input impedance remains constant.

It is an object of this invention to provide an improved gain control circuit whereby the sensitivity of the receiver may be adjusted without producing undesirable results.

It is a further object of the invention to provide a gain control circuit that operates in conjunction with a grounded-grid amplifier so as to effect changes in sensitivity without changing the input impedance of the amplifier.

These and other objects and advantages will become apparent from a detailed consideration of the drawing in which:

Figure 1 shows an embodiment of the invention wherein a negative gain control voltage is employed;

Figure 2 shows another embodiment of the invention wherein a positive gain control voltage is employed and wherein the gain control voltage is amplified by one of the I. F. amplifiers; and Figure 3 illustrates an embodiment of the invention wherein a positive gain control voltage is amplified by the additional electron discharge device that is employed to secure constant impedance inputs for all conditions of gain.

Although the circuits to be described are most useful in connection with radio frequency waves, it will be apparent that they may also be of use with waves of lower frequencies. Radio frequency energy is supplied by a transformer 2 and is coupled to the cathodes 4 and 6 of a tube 8 by a coupling condenser 10. The cathodes are connected to a source of fixed potential by a resistor 12. Cathode 4 forms part of an electron discharge device which also includes a grid 14 and a plate 16. The cathode 6 forms part of another electron discharge device which also includes a grid 18 and a plate 20. These electron discharge devices may be triodes and can be contained within separate envelopes or may be twin tubes as shown. A 6J6 type of tube has been found well suited for the purpose.

The grids 14 and 18 are grounded for radio frequency waves by condensers 22 and 24 respectively. The grid 18 is connected to a source of suitable negative potential by a resistor 26. A tuned circuit 28 is comprised of a condenser 30 that is in parallel with an inductance 32 and is connected between the plate 16 and the plate 20. The plate 20 is effectively grounded for radio frequency energy by a coupling condenser 34. B+ voltage is supplied to the plates 16 and 20 via a plate isolation resistor 36. The radio frequency energy appearing in the parallel resonant circuit 28 is coupled to succeeding stages by the magnetic coupling between the coil 32 and the coil 38 of the tuned circuit 40.

A gain control voltage is supplied to the grid 14 via a resistor 42. This voltage increases in a negative direction as the radio frequency energy supplied by the transformer 2 increases in amplitude, and may be derived by rectifying a portion of the I. F. output in a manner well known to those skilled in the art. A change in the gain control voltage will change the $G_m$ of the electron discharge device associated with the cathode 4, the grid 14 and the plate 16. The input impedance presented by the cathode 4 is a function of the $G_m$ of the associated electron discharge device, and therefore, a change in the $G_m$ would result in a change of the input impedance. However, where two electron discharge devices are connected as shown, the input impedance of one is parallel with the input impedance of the other. Therefore, if one of the input impedances is increased as the other is decreased and vice versa, the total input impedance can be maintained at a constant value for all practical purposes. This is actually accomplished by the arrangement shown in Figure 1, because the electron discharge devices are cathode coupled so that an increase in the gain or $G_m$ of one produces a decrease in the gain or $G_m$ of the other.

The embodiment of the invention shown in Figure 2 illustrates a way in which the gain control voltage can be applied to the electron discharge device comprised of the cathode 6, the grid 18 and the plate 20. It will be remembered that the radio frequency energy is not amplified by this electron discharge device because of the shunting action of the condenser 34. For purposes of convenience, those components which perform the same function in Figure 2 that they perform in Figure 1 will be given the same numerals. It will be noted that the tuned circuit 28 connected between the plates 16 and 20 of the tube 8 is coupled to a mixer 46. The output of the mixer is of course an intermediate carrier frequency, and this is amplified in accordance with well known principles by an amplifier 48. The gain control voltage may be derived in any suitable manner and may be applied to a control grid 50 of the I. F. amplifier 48. This D. C. voltage is amplified and appears across the plate load resistor 52. This amplified gain control voltage is then connected to grid 18 of the tube 8 via a resistor 54. Because the amplified gain control voltage swings in a positive direction with increase in received signal strength, it is applied to the grid 18 rather than to the grid 14, grid 14 is connected with a suitable fixed negative bias potential through resistor 42. As the R. F. carrier increases in amplitude, the gain control voltage present at the grid 18 swings in a positive direction. The $G_m$ in the lower half of the tube 8 is increased and the $G_m$ in the upper half of the tube 8 is decreased, thereby reducing the amount of gain available to the radio frequency signals.

The best signal-to-noise ratio can be secured by using delayed AGC. This can be accomplished by biasing the grid 18 beyond cut off for a no-signal condition. Maximum sensitivity is therefore attained until the control voltage reaches the cutoff point.

Figure 3 illustrates an apparatus embodying the principles of the invention wherein one of the grounded grid electron discharge devices serves as a direct current amplifier for the gain control voltage. Here again, similar components will be given the same numerals as in the Figures 1 and 2. As shown, the electron discharge devices are enclosed within separate envelopes 60 and 62 but, as pointed out with respect to Figure 1, it makes no difference in the principles of the invention whether there is one envelope or two. The output of the transformer 2 is coupled directly to the cathode 4 of an envelope 60. It is also coupled to the cathode 6 of an envelope 62 via a coupling condenser 64. The cathode 6 is connected to a suitable source of fixed potential, which may be one tap on a potentiometer 66, via an inductance coil 68. As before, the grids 14 and 18 are connected to alternating current ground potential by condensers 22 and 24. However, the tuned circuit 28 is connected between the plate 16 of the envelope 60 and a suitable source of positive potential instead of being connected to the plate 20 of the other electron discharge device as in Figures 1 and 2. The plate 20 of the envelope 62 is connected to the grid 14 of the tube 60. The grid 18 of the tube 62 is connected to a source 70 of gain control potential that increases in the positive direction as the radio frequency signal increases in amplitude. The source of gain control potential 70 is in series with a suitable negative potential available at the potentiometer 66.

*Operation of Figure 3*

In order that the grid 14 of the envelope 60 may operate at a negative D. C. potential, it is apparent that the plate 20 of the tube 62 must be maintained at a negative potential. This negative potential is available at a potentiometer 66. For this reason, the cathode 6 of the envelope 62 is also returned in a negative potential at the potentiometer 66. The condenser 64 prevents this negative potential from appearing at the cathode 4 of the envelope 60. The inductance coil 68 prevents the radio frequency energy from being coupled to the potentiometer 66. It will be noted that the grid 18 of the tube 62 is connected in series with the gain control voltage rectifier circuit 70 and that the latter is returned to to a point on the potentiometer 66 which is negative with respect to the point to which the cathode 6 is returned. Whenever the radio frequency energy supplied by the transformer 2 increases in amplitude, the output of the intermediate frequency amplifiers increases and the rectified voltage applied to the grid 18 increases in a positive direction. The D. C. potential thus provided to the grid 18 is amplified and applied to the grid 14 of the radio frequency amplifying tube 60. It will be noticed that the condenser 22 effectively shunts the D. C. amplifying discharge device within the envelope 62 as far as the radio frequency energy is concerned. The increase in the $G_m$ or the gain of the electron discharge device within the envelope 62 is therefore accompanied by a decrease in the gain of the electron discharge device within the envelope 60 so that the input impedance as seen from the transformer 2 remains substantially constant.

Having thus described my invention, what is claimed is:

1. Gain control apparatus comprising in combination a first electron discharge device having at least a cathode, a grid and a plate, a second electron discharge device having at least a cathode, a grid and a plate, connections between said cathodes, means adapted to be connected to a source of alternating current energy, coupling between said means and said cathodes, condensers connected between said grids and ground, a decoupling condenser connected between the plate of said second electron discharge device and ground, a parallel tuned circuit that is resonant to said alternating current energy connected between said plates, a source of fixed potential connected to the plate of said second discharge device, and a source of gain control voltage connected to the grid of said first discharge device.

2. Gain control apparatus comprising in combination a first electron discharge device having at least a plate, a grid and a cathode, a second electron discharge device having at least a plate, a grid and a cathode, an input circuit adapted to be energized from a source of alternating current energy of predetermined signal frequencies, said input circuit being connected between said cathodes and a point of reference potential condenser means effectively connecting each of said grids to said point of reference potential with substantially zero impedance for signal frequencies, a condenser connecting said plate of said second discharge device to said point of reference potential and of such value as to furnish a path between said plate and said point of reference potential of substantially zero impedance at signal frequencies, a load circuit responsive to said alternating current energy connected to the plate of said first electron discharge device, a source of gain control voltage that becomes more negative as said alternating current energy increases in amplitude, and coupling means for applying said gain control voltage to the grid of said first electron discharge device.

3. In a signal amplifying system, the combination of: a first and a second tube, each tube having a cathode element, each tube having a control element and anode element, means connecting each of said tubes as a grounded grid amplifier, an alternating current impedance connected with said amplifier cathodes to form a signal input circuit impedance common to both amplifiers, an output load circuit having substantial alternating current impedance coupled with said first tube anode element, means for preventing alternating current signals from passing from said anode element of said second tube through said output circuit, a source of fixed potential coupled with one of said tube control electrodes, and a source of variable gain control potential coupled with said other tube control electrode whereby said second tube functions with said first tube to maintain the total input impedance of said tubes to signal frequencies substantially constant despite changing gain control potential without transmitting any effective signal frequency component through said output circuit.

4. The invention as defined by claim 3, said source of gain control potential being one which becomes more positive as said alternating current energy increases in amplitude, said source of fixed potential being coupled with said control electrode of said first tube and said variable gain control potential being coupled to the control electrode of said second tube.

References Cited in the file of this patent

UNITED STATES PATENTS

| | | |
|---|---|---|
| 2,233,782 | Kimball | Mar. 4, 1941 |
| 2,247,316 | Smith | June 24, 1941 |
| 2,256,085 | Goodale | Sept. 16, 1941 |
| 2,276,565 | Crosby | Mar. 17, 1942 |
| 2,284,102 | Rosencrans | May 26, 1942 |
| 2,318,075 | Hollingsworth | May 4, 1943 |
| 2,363,985 | Moser | Nov. 28, 1944 |
| 2,460,907 | Schroeder | Feb. 8, 1949 |
| 2,519,359 | Dean | Aug. 22, 1950 |
| 2,546,837 | Stribling, Jr. | Mar. 27, 1951 |

FOREIGN PATENTS

| | | |
|---|---|---|
| 485,854 | Great Britain | May 25, 1938 |